United States Patent [19]

Bowen

[11] Patent Number: 4,907,978

[45] Date of Patent: Mar. 13, 1990

[54] SELF-RETAINING CONNECTOR

[75] Inventor: David C. Bowen, Downers Grove, Ill.

[73] Assignee: Robinson Nugent, Inc., New Albany, Ind.

[21] Appl. No.: 266,106

[22] Filed: Nov. 2, 1988

[51] Int. Cl.⁴ .................................... H01R 23/70
[52] U.S. Cl. ........................... 439/79; 29/837; 361/408
[58] Field of Search .......... 439/55, 68, 78–84; 228/180.1; 361/404, 405, 408; 29/837–845, 832

[56] References Cited

U.S. PATENT DOCUMENTS

| | | | |
|---|---|---|---|
| 3,239,720 | 3/1966 | Rayburn | 361/405 |
| 3,504,328 | 3/1970 | Olsson . | |
| 3,524,108 | 8/1970 | English | 439/82 |
| 3,614,546 | 10/1971 | Avins | 439/68 UX |
| 4,048,718 | 9/1977 | Rote | 29/739 |
| 4,150,863 | 4/1979 | Krafthefer et al. | 439/80 |
| 4,464,829 | 8/1984 | Whitley et al. | 29/838 |
| 4,550,962 | 11/1985 | Czeschka | 439/79 |

FOREIGN PATENT DOCUMENTS 147749 4/1981 German Democratic Rep. .

Primary Examiner—Neil Abrams
Attorney, Agent, or Firm—Barnes & Thornburg

[57] ABSTRACT

A connector is provided for mounting on a circuit board. The connector includes a body member and rows of first and second electrical contact pins coupled to the body member. The first contact pins are configured to extend downwardly below a bottom wall of the body member so that they align with the bottom wall to define an acute included angle therebetween. The second contact pins are configured to extend downwardly below the bottom wall in splayed relation to the first electrical contact pins and are aligned with the bottom wall to define an obtuse included angle therebetween. The first and second contact pins are made of spring material and cooperate to define a spring clip for yieldably drawing the bottom wall of the body member into seating engagement with the circuit board upon insertion of the first and second electrical contact pins into a pair of pin-receiving apertures formed in the circuit board.

21 Claims, 1 Drawing Sheet

SELF-RETAINING CONNECTOR

BACKGROUND AND SUMMARY OF THE INVENTION

The present invention relates to a connector that is mountable on a printed circuit board or the like. In particular, the present invention relates to a connector having contact pins that are configured to retain the connector on a circuit board during a soldering process.

Connectors are mounted on circuit boards to provide sockets for receiving mating contact pins of an electrical plug to connect various electronic components together. Connectors include bodies made of electrically insulative material and contact pins for coupling the body to the circuit board. Typically, these contact pins are inserted into apertures formed in the circuit board and liquid solder is introduced into the apertures around the contact pins in a wave-soldering process to capture the contact pins in the circuit board apertures.

In some cases, a connector is permanently mounted in an improper attitude or orientation on the circuit board if the connector "floats" from its designated attitude or orientation prior to or during the soldering process. This type of unwanted floating can occur if the connector is not retained securely in a fixed position on the circuit board and is characterized by "rocking" or other movement of the connector relative to the circuit board during exposure to handling or a solder wave.

One object of the present invention is to provide a connector or other electrical component that is able to retain itself in a stable and secure position on a circuit board prior to establishing a soldered connection between the circuit board and the contact pins.

Another object of the present invention is to provide a connector or other electrical component that includes contact pins which are spring-biased and configured to draw the body of the connector or component to a stable position against the circuit board to minimize any rocking or other movement which might occur during handling or exposure of the contact pins to a solder wave.

Yet another object of the present invention is to provide a method of making a self-retaining connector or other electrical component.

According to the present invention, a connector is provided for mounting on a circuit board. The connector includes a body member having a bottom wall and first and second electrical contact pins. The first electrical contact pin is coupled to the body member and configured to extend downwardly below the bottom wall and align with the bottom wall to define an acute included angle therebetween. The second electrical contact pin is coupled to the body member and configured to extend downwardly below the bottom wall in splayed relation to the first electrical contact pin and align with the bottom wall to define an obtuse included angle therebetween.

In preferred embodiments, the first and second electrical contact pins are made of an electrically conductive spring material to provide a "spring clip" suitably configured to retain the connector on a circuit board. In particular, at least one pair of first and second electrical contact pins are configured to define spring means for yieldably drawing the bottom wall of the body member into seating engagement with the circuit board upon insertion of the first and second electrical contact pins into a pair of pin-receiving apertures formed in the circuit board so that the body member is retained in a stable position on the circuit board.

The body member further includes a plurality of side walls and the first and second electrical contact pins are appended to one of the side walls to lie adjacent to the circuit board upon assembly of the connector onto the circuit board. Another of the side walls is formed to include socket means for receiving a plug so that an electrical component attached to the plug can be coupled to the circuit board via the connector.

The side wall designated to engage the contact pins is formed to include upper and lower pin-receiving apertures aligned in vertically spaced-apart relation. The upper aperture is situated to lie adjacent to a top wall of the body member and the lower aperture is situated intermediate the bottom wall and the upper aperture.

The first electrical contact pin is bent to provide a proximal leg inserted into the body member through the lower aperture and a distal leg aligned relative to the bottom wall to define an acute included angle therebetween. The second electrical contact pin is bent to provide a proximal leg inserted into the body member through the upper aperture and a distal leg aligned relative to the bottom wall to define an obtuse included angle therebetween. Thus, the distal legs of the first and second electrical contacts are aligned to diverge as they extend away from the body member to provide a spring clip means usable to retain the connector on the circuit board as well as to conduct an electrical current between the circuit board and a plug attached to the body member.

In a preferred embodiment, a plurality of pairs of first and second electrical connectors are arranged in rows and used to provide means for retaining the body member in a substantially fixed position on the circuit board during exposure to handling or a solder wave. The retaining means includes first and second rows of spaced-apart parallel electrical contact pins appended to one of the side walls.

The first row includes a plurality of electrical contact pins which are inserted into a companion row of upper apertures formed in the selected side wall. Each electrical contact pin in the first row operates to provide first spring means for yieldably pulling the bottom wall away from the circuit board upon insertion of the distal legs the first row of electrical contact pins into a first row of apertures formed in the circuit board. The second row includes a plurality of different electrical contact pins which are inserted into a companion row of lower apertures formed in the same side wall. Each electrical contact pin in the second row operates to provide second spring means counteracting the first spring means for yieldably urging the bottom wall into seated engagement on the circuit board upon insertion of the distal legs of the second row of electrical contact pins into a second row of apertures formed in the circuit board.

Additional objects, features, and advantages of the invention will become apparent to those skilled in the art upon consideration of the following detailed description of a preferred embodiment exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

Figure 2:
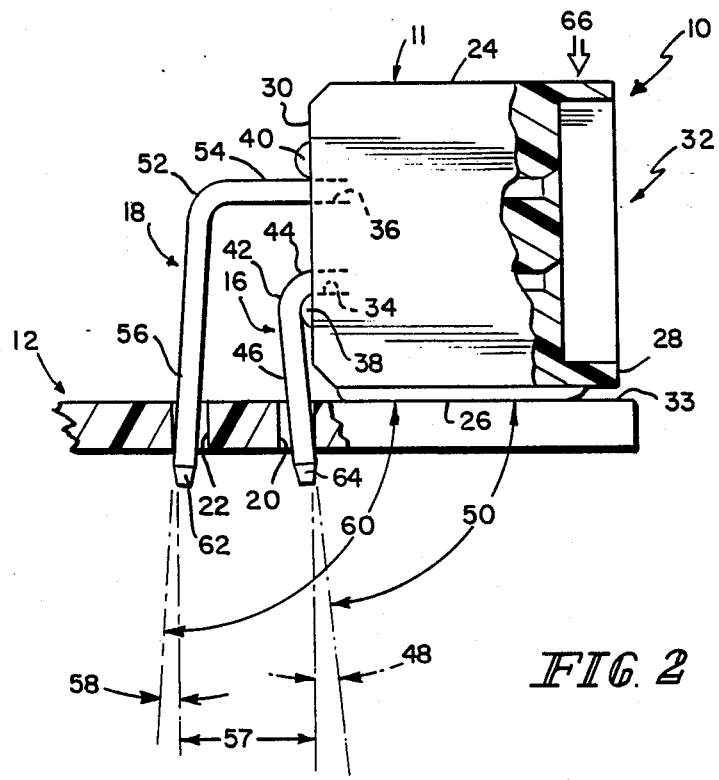
FIG. 2 is an enlarged side elevation view, with portions broken away, showing a pair of electrical contact pins inserted into apertures formed in a circuit board and spring-biased to retain the connector on the circuit board.

An electrical connector 10 is provided to permit an electrical coupling to be made between a circuit board 12 and a male plug 14. Typically, circuit board 12 has a printed circuit thereon and plug 14 is connected to cable or the like. Connector 10 includes a body member 11 and a plurality of electrical contact pins 16, 18 which are inserted into pin-receiving apertures 20, 22 formed in the circuit board as shown in FIG. 2. In assembly, liquid solder (not shown) is often introduced into apertures 20, 22 around pins 16, 18 to secure the pins 16, 18 to the circuit board 12 and ensure that electrical communication is established between the pins 16, 18 and the printed circuit on the circuit board 12.

It has been observed that connectors occasionally "float" or otherwise move relative to the underlying circuit board during the process of soldering the contact pins to the circuit board. Unfortunately, the attitude or orientation of a connector can deviate from a predetermined specification as a result of such floating to cause the connector to be misaligned relative to the circuit board during exposure of the contact pins on the connector to a solder wave. Of course, any connector misalignment becomes permanent once the solder hardens. Advantageously, electrical contact pins 16, 18 are configured to establish a self-retaining feature of connector 10 as shown in FIG. 2 and described in more detail below.

Body member 11 is made of an insulative material and illustratively includes a top wall 24, a bottom wall 26, and forward and rearward side walls 28, 30 extending between the top and bottom walls 24, 26 as shown in FIG. 2. The forward side wall 28 is formed to include a socket means 32 for receiving a male plug 14 or the like. The bottom wall 26 is configured to seat on top surface 33 of circuit board 12 without rocking and may be either flat or ribbed.

Figure 1:
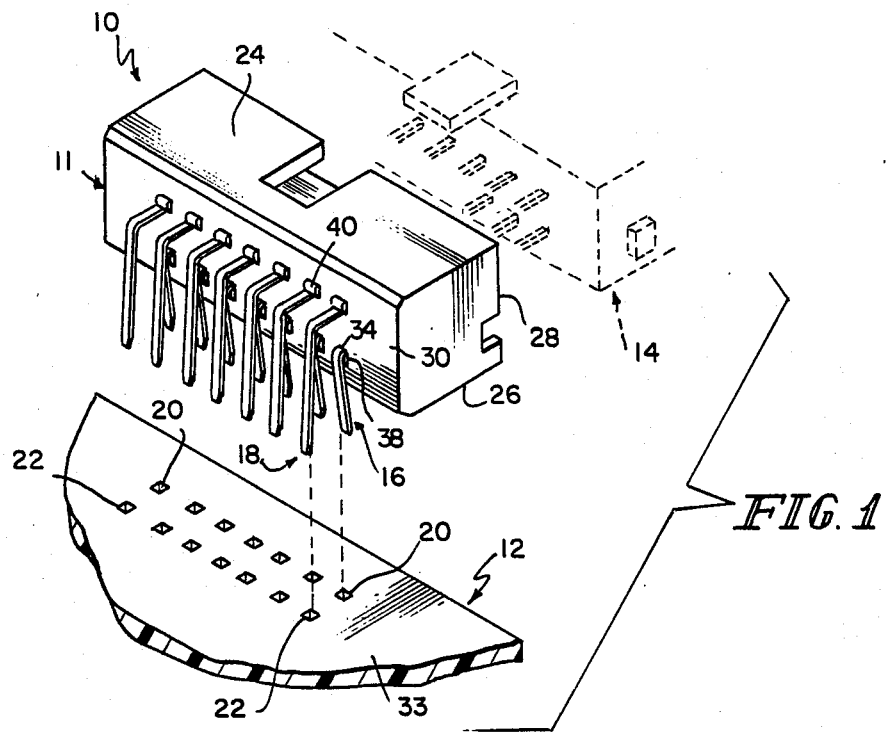
FIG. 1 is a perspective view of a self-retaining connector in accordance with the present invention, the connector being shown to include pairs of electrical contact pins for engaging a circuit board and a socket for receiving a plug shown in phantom.

The connector 10 is formed to include two vertically spaced-apart parallel rows of pin-receiving passages extending between the rearward side wall 30 and the socket means 32 to receive a plurality of contact pins 16, 18 as shown best in FIG. 1. Each pin-receiving passageway in the lower row includes an aperture 34 for receiving one of the first electrical contact pins 16, while each pin-receiving passageway in the upper row includes an aperture 36 for receiving one of the second electrical contact pins 18. The body member 11 is also formed to include a lower boss 38 beneath each lower aperture 34 and an upper boss 40 above each upper aperture 36 as shown best in FIG. 2.

Each first electrical contact pin 16 is made out of an electrically conductive resilient material such as phosphor bronze. A proximal end 44 of each first electrical contact pin 16 is first inserted into one of the lower apertures 34 in the lower row of pin-receiving passageways and fixed therein using conventional means to anchor the pin 16 to the body member. After insertion into a lower body member aperture 34, the first electrical contact pin is bent at bight 42 to provide the proximal portion 44 and a distal portion 46 as shown best in FIG. 2. After such bending, the proximal and distal portions 44, 46 are aligned to define an acute included angle therebetween.

Each pin 16 is arranged as shown in FIG. 2 to orient the distal end 46 at a predetermined angle 48 of about 4° with respect to the vertical so that the distal end 46 and the bottom wall 26 are aligned to define an acute included angle 50 of about 86° therebetween. Thus, each proximal portion 44 is anchored in body member 11 in substantially spaced-apart parallel relation to bottom wall 26.

Each second electrical contact pin 18 is likewise made out of an electrically conductive resilient material such as phosphor bronze so that once it is fixed to body member 11 it will cooperate with a companion first electrical contact pin 16 to provide a spring clip suitable for retaining body member 11 in a seated position flush to the circuit board 12. A proximal end 54 of each second electrical contact pin 18 is inserted into one of the upper apertures 36 in the upper row of pin-receiving passageways and fixed therein to anchor the pin 18 to the body member 11. After insertion into an upper body member aperture 36, the second electrical contact pin 18 is bent at bight 52 to provide the proximal portion 54 and a distal portion 56 as shown best in FIG. 2. After such bending, the proximal and distal portions 54, 56 are aligned to define an obtuse included angle therebetween.

Each pin 18 is arranged as shown in FIG. 2 to position the distal tip 62 of pin 18 at a predetermined location which is a specified distance 57 from the position of distal tip 64 of a companion pin 16. In effect, each pin 18 is arranged to orient the distal end 56 at a small predetermined angle 58 of about 4° with respect to the vertical so that distal end 56 and the bottom wall 26 are aligned to define an obtuse included angle 60 of about 94° therebetween. This arrangement causes the distal portions 46, 56 of contact pins 16, 18, respectively, to be aligned in splayed relation so that they diverge as they extend away from the body member 11. In the illustrated embodiment, each proximal portion 54 is anchored in body member 11 in spaced-apart parallel relation to bottom wall 26 and each proximal portion 44.

Connector 10 is mounted on circuit board 12 by inserting the tips 62 of distal portions 56 of the row of second contact pins 18 into the apertures 22 formed in circuit board 12. The bottom wall 26 of body member 11 will tend to pull away from top surface 33 of circuit board 12 because of the spring character of contact pins 18. The tips 64 of first contact pins 16 are then inserted into the apertures 20 formed in circuit board 12. Spring forces generated by the first contact pins 16 upon insertion into circuit board apertures 20 are sufficient to counteract opposing spring forces generated by second contact pins 18 and yieldably draw the bottom wall 26 of body member 11 into seating engagement with the top surface 33 of the circuit board 12.

Pressure should be applied to the top wall 24 of body member 11 along the longitudinally extending edge represented by the double arrow 66 when mounting connector 10 on circuit board 12 so that the bottom wall 26 will seat fully against circuit board 12 to ensure parallelism with top surface 33. The spring forces generated by pins 16 and 18 act as a wedge to hold connector 10 down onto the circuit board 12 to minimize the likelihood that connector 10 will float or otherwise move relative to circuit board 12 during handling or soldering.

Advantageously, a design in accordance with the present invention can be manufactured on a standard assembly machine. The splayed configuration of electrical contact pins 16, 18 results in a connector 10 which has a low insertion force to permit easy mounting to circuit board 12 and a sufficient retention force to inhibit misorientation of connector 10 on circuit board 12 or to prevent connector 10 from falling out of circuit board 12. Further, a design in accordance with the present invention can be used with existing circuit boards since no special circuit board footprint is required.

In addition, the present invention is applicable to body members of many shapes and sizes. For example, the present invention is well-suited for use with relatively compact "naked headers" (not shown) which have no extended side walls comparable to the relatively high side walls of body member 11 illustrated in FIGS. 1 and 2.

Although the invention has been described in detail with reference to a preferred embodiment, variations and modifications exist within the scope and spirit of the invention as described and defined in the following claims.

What is claimed is:

1. A connector mountable on a circuit board, the connector comprising
   a body member having a bottom wall,
   a first electrical contact pin coupled to the body member and configured to extend downwardly below the bottom wall and to align with the bottom wall to define an obtuse included angle therebetween to provide first spring means for yieldably pulling the bottom wall away from the circuit board upon insertion of the first electrical contact pin in an aperture formed in the circuit board, and
   a second electrical contact pin coupled to the body member and configured to extend downwardly below the bottom wall in splayed relation to the first electrical contact pin and to align with the bottom wall to define an acute included angle therebetween to provide second spring means counteracting the first spring means for yieldably urging the bottom wall into seated engagement on the circuit board upon insertion of the second electrical contact pin into a second aperture formed in the circuit board.

2. The connector of claim 1, wherein the second electrical contact pin includes a proximal leg coupled to the body member and a distal leg oriented relative to the proximal leg to define an acute included angle therebetween.

3. The connector of claim 1, wherein the body member further includes a plurality of side walls and the first and second electrical contact pins are appended to one of the side walls.

4. The connector of claim 3, wherein another of the side walls is formed to include socket means for receiving a plug.

5. The connector of claim 3, wherein said one of the side walls is formed to include upper and lower apertures aligned in vertically spaced-apart relation so that the lower aperture is situated intermediate the bottom wall and the upper aperture, the second electrical contact pin is bent to provide a proximal leg inserted into the body member through the lower aperture and a distal leg aligned relative to the bottom wall to define an acute included angle therebetween, and the first electrical contact pin is bent to provide a proximal leg inserted into the body member through the upper aperture and a distal leg aligned relative to the bottom wall to define an obtuse included angle therebetween.

6. The connector of claim 5, wherein the proximal legs of the first and second electrical contact pins are aligned in spaced-apart parallel relation.

7. The connector of claim 5, wherein the distal legs of the first and second electrical contact pins are aligned in coplanar relation.

8. The connector of claim 5, wherein the proximal and distal legs of the second electrical contact pin cooperate to define an acute included angle therebetween.

9. The connector of claim 5, wherein the proximal and distal legs of the first electrical contact pin cooperate to define an obtuse included angle therebetween.

10. The connector of claim 1, wherein the first and second electrical contact pins are aligned in non-parallel, diverging relation.

11. The connector of claim 1, wherein the body member further includes a side wall and each of the first and second electrical contact pins include a proximal portion appended to the side wall and a distal portion bent at an angle to the proximal portion to extend in a direction toward the bottom wall.

12. The connector of claim 11, wherein the distal portion of the second electrical contact pin cooperates with the bottom wall to define an acute included angle therebetween.

13. The connector of claim 11, wherein the distal portion of the first electrical contact pin cooperates with the bottom wall to define an obtuse included angle therebetween.

14. The connector of claim 3, wherein the second electrical contact pin includes a proximal portion appended to a first side wall of the body member, and the first electrical contact pin has a proximal portion appended to the first side wall of the body member in vertically spaced-apart relation to the bottom wall so that the proximal portion of the second electrical contact pin is situated intermediate the proximal portion of the first electrical contact pin and the bottom wall and a distal portion configured to extend downwardly beyond the bottom wall in splayed relation to the second electrical contact pin and align with the bottom wall to define an obtuse included angle therebetween so that the distal portions of each first and second electrical contact pins are aligned in downwardly diverging relation.

15. A connector mountable on a circuit board, the connector comprising
   a body member having a bottom wall and a plurality of side walls, and
   means for retaining the body member in a substantially fixed position on the circuit board, the retaining means including first and second rows of electrical contact pins appended to one of the side walls, the first row of electrical contact pins cooperating to provide first spring means for yieldably pulling the bottom wall away from the circuit board upon insertion of the first row of electrical contact pins into a first row of apertures formed in the circuit board, the second row of electrical contact pins cooperating to provide second spring means counteracting the first spring means for yieldably urging the bottom wall into seated engagement on the circuit board upon insertion of the second row of electrical contact pins into a second row of apertures formed in the circuit board.

16. The connector of claim 15, wherein each electrical contact pin in the first row is bent and includes a proximal portion appended to said one of the side walls and a downwardly extending distal portion aligned relative to the bottom wall to define an obtuse included angle therebetween.

17. The connector of claim 16, wherein the distal portions of the electrical contact pins in the first row are aligned in substantially coplanar relation.

18. The connector of claim 16, wherein each electrical contact pin in the second row is bent and includes a proximal portion appended to said one of the side walls and a downwardly extending distal portion aligned relative to the bottom wall to define an acute included angle therebetween.

19. The connector of claim 18, wherein the distal portions of the electrical contact pins in the second row are aligned in substantially coplanar relation.

20. The connector of claim 15, wherein each electrical contact pin is made of spring material and terminates in a distal tip, each electrical contact pin in the first row has a companion electrical contact pin in the second row, the electrical contact pins comprising each pair of companion electrical contact pins extend downwardly in splayed relation to define an acute included angle therebetween so that the distal tips of said electrical contact pins comprising each companion pair are normally yieldably biased to a predetermined spread connector-retaining position and are movable toward one another to a spring-biased connector-mounting position during insertion of the electrical contact pins into the circuit board apertures.

21. The connector of claim 15, wherein another of the side walls is formed to include socket means for receiving a plug.

* * * * *